(12) United States Patent
Koh et al.

(10) Patent No.: US 6,387,589 B1
(45) Date of Patent: May 14, 2002

(54) PHOTORESIST POLYMERS AND PHOTORESIST COMPOSITIONS CONTAINING THE SAME

(75) Inventors: Cha Won Koh; Geun Su Lee; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 47days.

(21) Appl. No.: 09/640,262

(22) Filed: Aug. 16, 2000

(30) Foreign Application Priority Data

Aug. 17, 1999 (KR) .............................. 99-33885

(51) Int. Cl.[7] .......................... G03F 7/004; C08F 10/00
(52) U.S. Cl. .................. 430/270.1; 430/914; 430/921; 526/281; 526/272; 526/242; 526/255
(58) Field of Search .............................. 430/270.1, 914, 430/921, 910, 905; 526/281, 272, 242, 250, 255

(56) References Cited

U.S. PATENT DOCUMENTS

| | | | |
|---|---|---|---|
| 6,143,466 A | * 11/2000 | Choi | 430/270.1 |
| 6,146,810 A | * 11/2000 | Seo et al. | 430/270.1 |
| 6,265,130 B1 | * 7/2001 | Lee et al. | 430/270.1 |
| 6,265,131 B1 | * 7/2001 | Chang et al. | 430/270.1 |
| 6,268,106 B1 | * 7/2001 | Park et al. | 430/270.1 |
| 6,291,131 B1 | * 9/2001 | Jung et al. | 430/270.1 |
| 2001/0031420 A1 | * 10/2001 | Lee et al. | 430/270.1 |

FOREIGN PATENT DOCUMENTS

| | | | | |
|---|---|---|---|---|
| JP | 2000086726 A | * | 3/2000 | C08F/32/00 |
| JP | 2000206683 A | * | 7/2000 | G03F/7/004 |

* cited by examiner

Primary Examiner—Janet Baxter
Assistant Examiner—Yvette M. Clarke
(74) Attorney, Agent, or Firm—Townsend & Townsend and Crew LLP (57) ABSTRACT

The present invention provides photoresist polymers and photoresist compositions comprising the same. The photoresist polymer is represented by the following Chemical Formula 5. Photoresist compositions containing the polymers of the present invention have superior transmittance at 157 nm wavelength, etching resistance, heat resistance, and adhesiveness. In addition, photoresist compositions of the present invention can be developed easily in 2.38 wt % aqueous TMAH solution, and are therefore suitable for lithography processes using a 157 nm wavelength-light source for fabricating a minute circuit of a high integration semiconductor device:

<Chemical Formula 5>

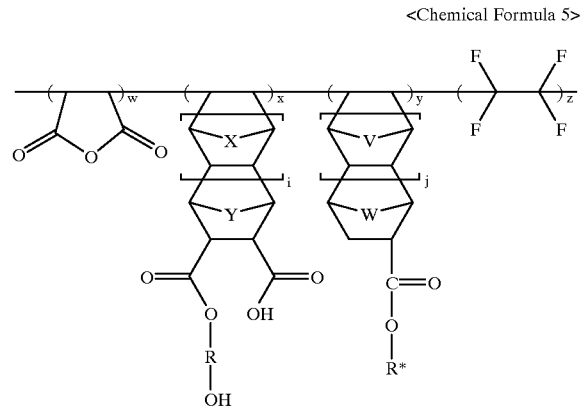

wherein R, R*, X, Y, V, W, i, j, w, x, y and z are as described herein.

24 Claims, 3 Drawing Sheets

PHOTORESIST POLYMERS AND PHOTORESIST COMPOSITIONS CONTAINING THE SAME

BACKGROUND OF THE INVENTION

1. Field of the Invention

The present invention relates to photoresist polymers and photoresist compositions containing the same, and in particular to photoresist polymers and compositions that are suitable for photolithography processes employing KrF, ArF, EUV and preferably 157 nm light sources like VUV.

2. Description of the Prior Art

Recently, chemical amplification-type DUV photoresists have been investigated in order to achieve high sensitivity in minute image formation processes for preparing semiconductor devices. Such photoresists are prepared by blending a photoacid generator and matrix resin polymer having an acid labile group.

In a photolithography process, an exposure of photoresist to light of a particular wavelength generates an acid from the photoacid generator that is present in the photoresist. This acid causes the main chain or the branched chain of the resin to decompose or become cross-linked. In addition, the acid removes the acid labile group and changes the polarity of the photoresist in the exposed region. This polarity change creates a solubility difference between the exposed portion and the unexposed portion in a developing solution, thereby allowing a pattern formation. The resolution of the pattern that is formed depends on the wavelength of the light source—i.e., in general, a shorter wavelength allows formation of more minute patterns.

In general, a useful photoresist (hereinafter, abbreviated as "PR") has a variety of desired characteristics, such as excellent etching resistance, heat resistance and adhesiveness. In addition, a photoresist should be easily developable in a commercially readily available developing solution, such as 2.38% aqueous tetramethylammonium hydroxide (TMAH) solution. Furthermore, it should provide a good pattern formation using a light source of wavelength of 157 nm. However, it is very difficult to synthesize a photoresist polymer that satisfies all of these desired characteristics. For example, a polymer having a polyacrylate polymer backbone are readily available, but it has poor etching resistance, difficult to develop and impossible to obtain a good minute pattern due to its poor transmittance at wavelength of 157 nm.

Figure 1:
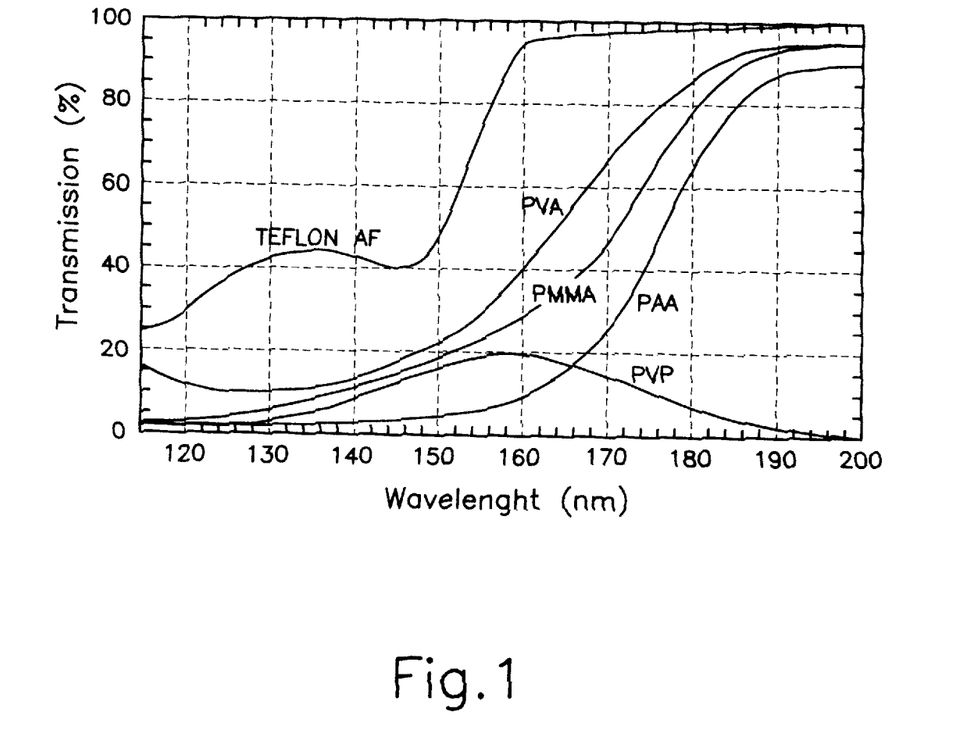
FIG. 1 is a graph of transmittance versus wavelength of various resins.
Figure 2A:
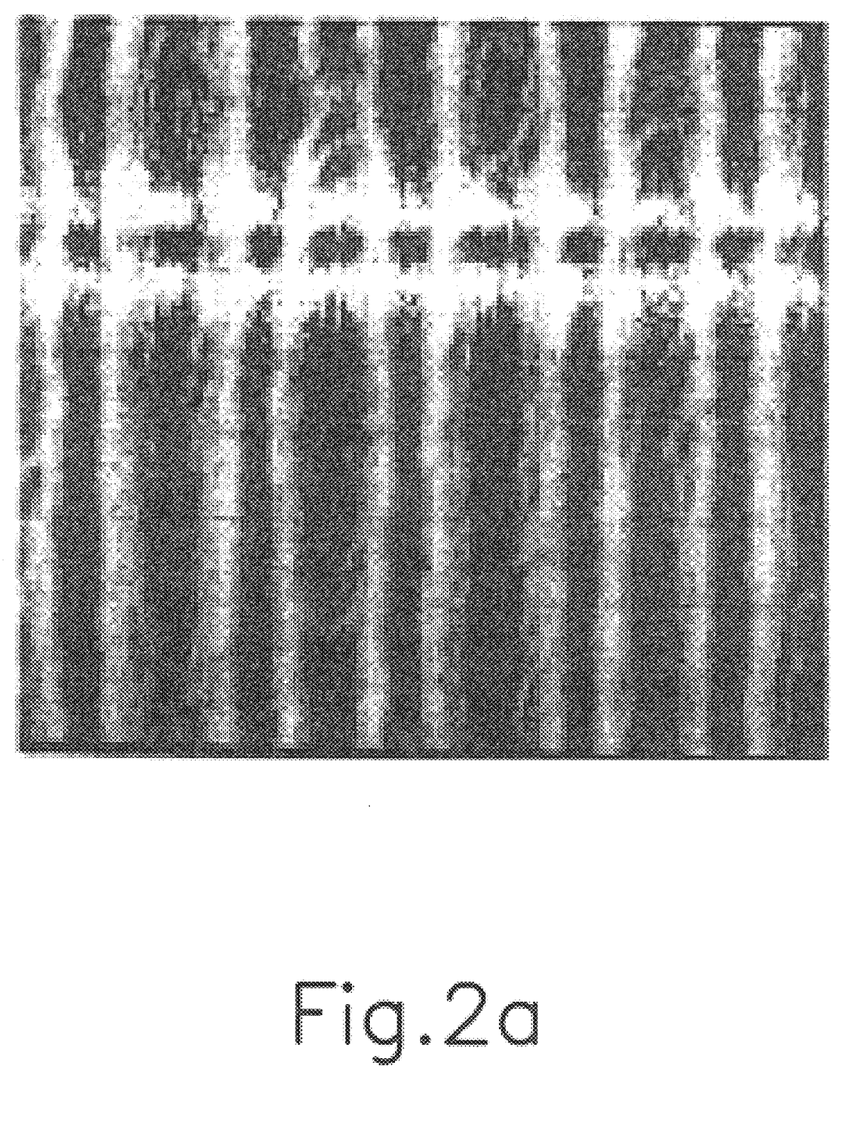
FIG. 2a shows a failed pattern formation due to a poor transmittance of photoresist.
Figure 2B:
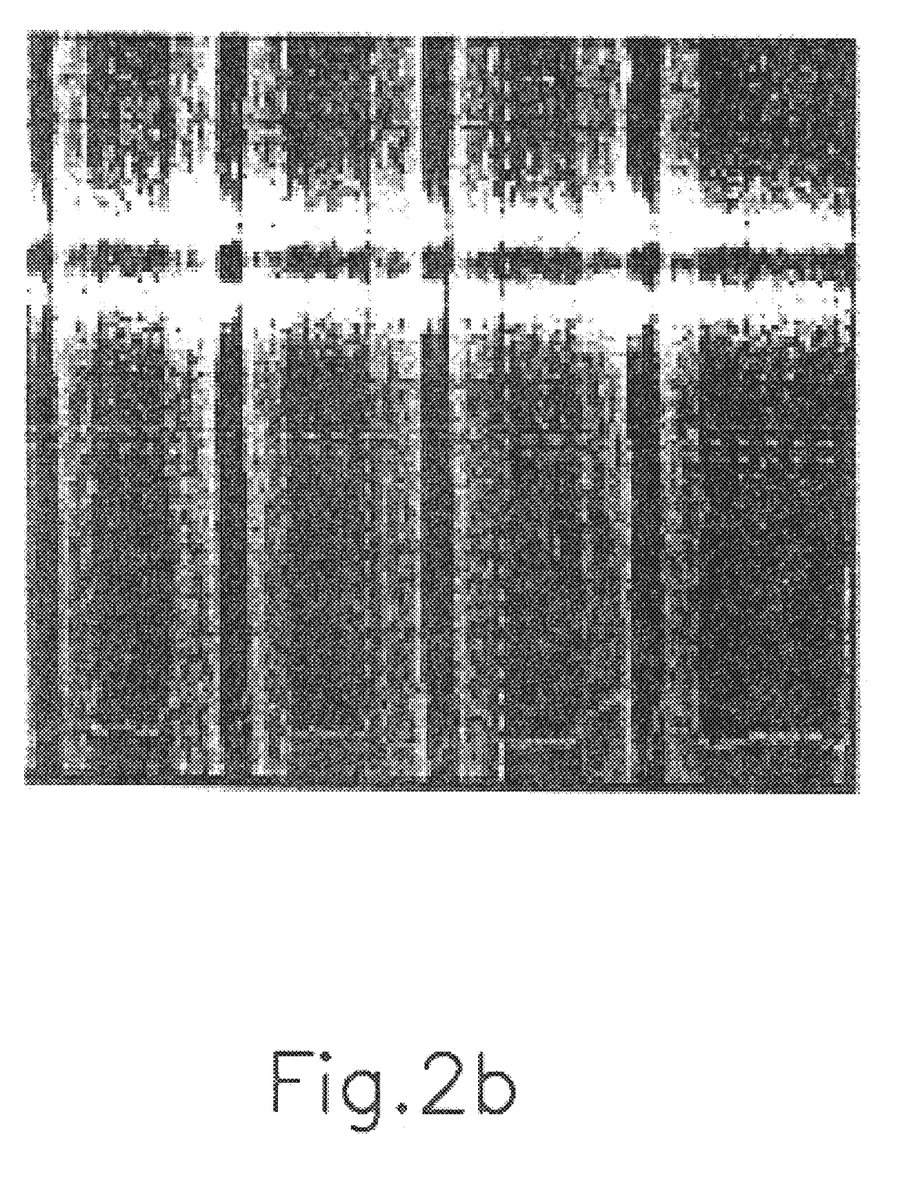
FIG. 2b shows a difference in CD between a photoresist's upper portions and lower portions due to a poor transmittance of photoresist.

FIG. 1 shows transmittance of several resins at wavelength near 157 nm. For example, PVP (poly vinyl pyrrolidine) which is typically used for wavelength of 248 nm (KrF light source), and PMMA (poly methyl methacrylate) which is typically used for wavelength of 193 nm (ArF light source) showed relatively poor transmittance at 157 nm. If these resins, which have poor transmittance at wavelength of 157 nm, are used for a pattern formation with 157 nm wavelength light, most of the light can not reach the lower portions of the PR resulting in a poor or no pattern formation (see FIG. 2a). In addition, even if the light cm penetrate to the lower portions of the PR, the difference in the intensity of light reaching the upper portion and the lower portion of the PR will cause a large gap in CD of both portions of the PR, thus creating line patterns with a severe slope, i.e., CD of the upper portion of PR will be relatively small and CD of the lower portion will be relatively large (see FIG. 2b). Hence, the shape or the pattern formed using these PR at 157 nm wavelength is not suitable for fabricating a semiconductor element.

SUMMARY OF THE INVENTION

An object of the present invention is to provide novel photoresist polymers having a good or excellent transmittance at 157 nm wavelength, etching resistance, adhesiveness and photosensitivity, and a process for preparing the same.

Another object of the present invention is to provide photoresist compositions comprising the PR polymers described above, and a process for preparing the same.

Still another object of the present invention is to provide a semiconductor element produced by using the photoresist composition.

DETAILED DESCRIPTION OF THE INVENTION

The present invention provides polymers derived from monomers of Chemical Formulas 1–4 below. Backbone of such polymers is an alicyclic structure, which provides excellent adhesiveness and etching resistance, and a fluorocarbon structures which provides great transmittance at the wavelength of 157 nm. Moreover, the exposed region and the unexposed region of polymers of the present invention have a considerable solubility difference in a developing solution.

In one particular aspect, the present invention provides a photoresist polymer derived from a monomer comprising:

(a) a compound of Chemical Formula 1;

where R is substituted or unsubstituted linear or branched ($C_1$–$C_{10}$) alkylene, substituted or unsubstituted ($C_2$–$C_{10}$) alkylene comprising an ether linkage, substituted or unsubstituted ($C_2$–$C_{10}$) alkylene comprising an ester linkage, or substituted or unsubstituted ($C_3$–$C_{10}$) alkylene comprising a ketone moiety; X and Y are independently $CH_2$, $CH_2CH_2$, oxygen or sulfur; and i is an integer from 0 to 2;

(b) a compound of Chemical Formula 2;

2 where V and W are independently $CH_2$, $CH_2CH_2$, oxygen or sulfur; R* is an acid-labile group; and j is an integer from 0 to 2;

(c) tetrafluoro ethene of Chemical Formula 3;

3 and
optionally (d) maleic anhydride of Chemical Formula 4:

4

Preferably, R is represented by the following Chemical Formula 1a:

$$-(CH_2)_m-Z-(CH_2)_n-\qquad 1a$$

where Z is or oxygen; $R_1$ and $R_2$ are independently H or an ($C_1$–$C_5$) alkyl; and m and n are independently an integer from 0 to 5, provided m and n are independently an integer from 1 to 5 when Z is oxygen.

Preferably, R* is selected from the group consisting of tert-butyl, tetrahydrofuran-2-yl, tetrahydropyran-2-yl, 2-ethoxyethyl and tert-butoxyethyl.

Preferably, the compound of Chemical Formula 1 is selected from the group consisting of:
mono-2-ethyl-2-(hydroxymethyl)butyl bicyclo[2.2.1]hept-5-ene-2,3-dicarboxylate;
mono-2-dimethyl-3-hydroxypropyl bicyclo[2.2.1]hept-5-ene-2,3-dicarboxylate;
mono-3-hydroxypropyl bicyclo[2.2.1]hept-5-ene-2,3-dicarboxylate;
mono-2-hydroxyethyl bicyclo[2.2.1]hept-5-ene-2,3-dicarboxylate;
mono-2-ethyl-2-(hydroxymethyl)butyl bicyclo[2.2.2]oct-5-ene-2,3-dicarboxylate;
mono-2-dimethyl-3-hydroxypropyl bicyclo[2.2.2]oct-5-ene-2,3-dicarboxylate;
mono-3-hydroxypropyl bicyclo[2.2.2]oct-5-ene-2,3-dicarboxylate;
mono-2-hydroxyethyl bicyclo[2.2.2]oct-5-ene-2,3-dicarboxylate;
mono-2-ethyl-2-(hydroxymethyl)butyl tetracyclo[4.4.0.1.1]dodec-7-ene-2,3-dicarboxylate;
mono-2-dimethyl-3-hydroxypropyl tetracyclo[4.4.0.1.1]dodec-7-ene-2,3-dicarboxylate;
mono-3-hydroxypropyl tetracyclo[4.4.0.1.1]dodec-7-ene-2,3-dicarboxylate;
mono-2-hydroxyethyl tetracyclo[4.4.0.1.1]dodec-7-ene-2,3-dicarboxylate;
mono-2-ethyl-2-(hydroxymethyl)butyl tetracyclo[4.4.0.2.2]tetradec-7-ene-2,3-dicarboxylate,
mono-2-dimethyl-3-hydroxypropyl tetracyclo[4.4.0.2.2]tetradec-7-ene-2,3-dicarboxylate;
mono-3-hydroxypropyl tetracyclo[4.4.0.2.2]tetradec-7-ene-2,3-dicarboxylate; and
mono-2-hydroxyethyl tetracyclo[4.4.0.2.2]tetradec-7-ene-2,3-dicarboxylate.

Preferably, the compound of Chemical Formula 2 is selected from the group consisting of the following compounds:
tert-butyl bicyclo[2.2.1]hept-5-ene-2-carboxylate;
tert-butyl bicyclo[2.2.2]oct-5-ene-2-carboxylate;
tert-butyl tetracyclo[4.4.0.1.1]dodec-7-ene-2-carboxylate; and
tert-butyl tetracyclo[4.4.0.2.2]tetradec-7-ene-2-carboxylate.

Preferred photoresist polymers according to the present invention are represented by following Chemical Formula 5:

5 where R, R*, X, Y, V, W, i and j are those defined above, and w, y, x, and z represent the relative amounts of each monomer, wherein the ratio of w:x:y:z=0–85 mol %:5–90 mol %:5–90 mol %:5–90 mol %.

Each units in the polymer of formula 5 represents a total relative ratio of each units. Thus, formula 5 is not intended to indicate any particular order of each units. For example, the total amount "w" of the unit derived from maleic anhydride may be inter dispersed throughout the polymer or it may be concentrated in one particular location of the polymer.

Preferred polymers of the present invention include:
Poly(maleic anhydride/mono-2-ethyl-2-(hydroxymethyl) butyl bicyclo-[2.2.1]hept-5-ene-2,3-dicarboxylate/tert-butyl bicyclo-[2.2.1]hept-5-ene-2-carboxylate/tetrafluoro ethylene);

Poly(maleic anhydride/mono-2-ethyl-2-(hydroxymethyl) butyl bicyclo-[2.2.2]oct-5-ene-2,3-dicarboxylate/tert-butyl bicyclo-[2.2.1]hept-5-ene-2-carboxylate/tetrafluoro ethylene);

Poly(maleic anhydride/mono-2-methyl-2-(hydroxymethyl) propyl bicyclo-[2.2.1]hept-5-ene-2,3-dicarboxylate/tert-butyl bicyclo-[2.2.1]hept-5-ene-2-carboxylate/tetrafluoro ethylene), Polymers of the present invention can be prepared by a variety of methods. In one particularly preferred method, polymers of the present invention are prepared by admixing (i) a compound of Chemical Formula 1, (ii) a compound of Chemical Formula 2, (iii) tetrafluoro ethene of Chemical Formula 3, (iv) maleic anhydride of Chemical Formula 4, and (v) a polymerization initiator, under conditions sufficient to produce the polymer. Typically, the polymerization conditions include heating the above described admixture to temperature in the range of from about 60 to about 70° C. for 4 to 24 hours under an inert atmosphere, preferably under a nitrogen or an argon atmosphere.

In the above preparation process, polymerization is performed by a bulk or solution polymerization.

Preferably, the admixture described above further comprises an organic solvent. While a variety of organic solvents can be used to prepare the polymers of the present invention, the organic solvent is preferably selected from the group consisting of cyclohexanone, tetrahydrofuran, dimethylformamide, dimethylsulfoxide, dioxane, methyl ethyl ketone, benzene, toluene, xylene, and mixtures thereof.

Advantageously, the polymerization initiator is selected from the group consisting of benzoyl peroxide, 2,2'-azobisisobutyronitrile (AIBN), acetyl peroxide, lauryl peroxide, tert-butyl peracetate, tert-butyl hydroperoxide and di-tert-butyl peroxide.

Alternatively, it is contemplated that the polymers of the present invention may be prepared without the maleic anhydride monomer using known polymerization techniques, for example, by using a metal catalyst process as described in Goodall et al, PCT Publication Number WO 96/37526.

The present invention also provides a photoresist composition comprising a photoresist polymer described above, an organic solvent and a photoacid generator.

Sulfide or onium-type compounds are preferably used as the photoacid generator. Suitable photoacid generators are selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Preferably, the amount of photoacid generator is in the range of 0.1 to 10% by weight of the polymer.

The organic solvent is preferably selected from the group consisting of methyl 3-methoxypropionate, ethyl 3-ethoxypropionate, propylene glycol methyl ether acetate and cyclohexanone.

In one aspect of the present invention, the photoresist composition is prepared by dissolving the polymer in an amount of 10 to 30% by weight of the organic solvent employed, blending the photoacid generator in an amount of 0.1 to 10% by weight of the polymer employed, and filtering the resulting mixture with a hyperfine filter.

Photoresist compositions of the present invention have superior etching resistance, heat resistance and adhesiveness relative to most other conventional PR compositions. In addition, photoresist compositions of the present invention can be developed in 2.38 wt % aqueous TMAH solution. Moreover, due to their excellent transmittance at 157 nm wavelength, photoresist compositions of the present invention can be used as photoresist films employing 157 nm wavelength light source.

The present invention also provides a process for forming a photoresist pattern comprising the steps of:

(a) coating a photoresist composition described above on a substrate of semiconductor device to form a photoresist film;

(b) exposing the photoresist film to light using a light source; and (c) developing the exposed photoresist film.

The process for forming the photoresist pattern can further include a baking step before and/or after the exposure step (b). Preferably, the baking step is performed at temperature in the range of from about 70 to about 200° C.

Exemplary light sources which are useful for forming the PR pattern include VUV (157 nm), ArF (193 nm), KrF (248 nm), EUV (13 nm), E-beam, X-ray and ion beam.

The irradiation energy is preferably in the range of from about 0.1 mJ/cm$^2$ to about 100 mJ/cm$^2$, and more preferably from about 0.1 mJ/cm$^2$ to about 10 mJ/cm$^2$.

The developing step (c) can be carried out using an alkali developing solution or distilled water. The alkali developing solution is preferably an aqueous solution comprising from about 0.01 to about 5 wt % of TMAH.

In another embodiment, the present invention provides a semiconductor device, which is manufactured using the photoresist composition described above.

Additional objects, advantages, and novel features of this invention will become apparent to those skilled in the art upon examination of the following examples thereof, which are not intended to be limiting.

I. PREPARATION OF PHOTORESIST POLYMERS

EXAMPLE 1

Synthesis of poly(maleic anhydride/mono-2-ethyl-2-(hydroxymethyl)butyl bicyclo-[2.2.1]hept-5-ene-2,3-dicarboxylate/tert-butyl bicyclo-[2.2.1]hept-5-ene-2-carboxylate/tetrafluoro ethylene)

To a solution of tetrahydrofuran was added 1.0 mole of maleic anhydride, 0.1 mole of mono-2-ethyl-2-(hydroxymethyl)butyl bicyclo-[2.2.1]hept-5-ene-2,3-dicarboxylate, 0.8 mole of tert-butyl bicyclo-[2.2.1]hept-5-ene-2-carboxylate, 0.1 mole of tetrafluoro ethene, and 0.5 to 10 g of AIBN. The resulting mixture was heated to temperature in the range of from about 60 to about 70° C. for 4 to 24 hours under a nitrogen or argon atmosphere.

The polymer thus prepared was precipitated in ethyl ether or hexane and dried to yield a polymer of Chemical Formula 6.

EXAMPLE 2

Synthesis of poly(maleic anhydride/mono-2-ethyl-2-(hydroxymethyl)butyl bicyclo-[2.2.2]oct-5-ene-2,3-dicarboxylate/tert-butyl bicyclo-[2.2.1]hept-5-ene-2-carboxylate/tetrafluoro ethylene)

A polymer of Chemical Formula 7 was prepared by repeating the procedure of Example 1 but using 0.1 mole of mono-2-ethyl-2-(hydroxymethyl)butyl bicyclo-[2.2.2]oct-5-ene-2,3-dicarboxylate instead of 0.1 mole of mono-2-ethyl-2-(hydroxymethyl)butyl bicyclo-[2.2.1]hept-5-ene-2,3-dicarboxylate.

II. PREPARATION OF PHOTORESIST COMPOSITIONS, AND FORMATION OF PATTERN

EXAMPLE 3

To 40 g of methyl 3-methoxypropionate was added 10 g of the polymer prepared in Example 1, and 0.01 to 1 g of triphenylsulfonium triflate or dibutylnaphthylsulfonium triflate. The resulting mixture was stirred and filtered through a 0.10 μm filter.

The photoresist composition thus prepared was spin-coated on a silicon wafer, and soft-baked in an oven or hot plate of 80 to 150° C. for 1 to 5 minutes. After baking, the photoresist was exposed to light by using an ArF laser exposer, and then post-baked at 100 to 200° C. When the post-baking was completed, it was developed in 2.38 wt % aqueous TMAH (tetramethylammonium hydroxide) solution for 90 seconds, to obtain a 0.13 μm L/S pattern (the thickness of the photoresist layer was about 0.2 μm).

EXAMPLE 4

A photoresist composition was prepared by repeating the procedure of Example 3 but using the polymer prepared in Example 2 instead of the polymer of Example 1. By employing this composition, a 0.13 μm L/S pattern was obtained using the photoresist layer thickness at about 0.2 μm.

Photoresist compositions prepared using polymers of the present invention have excellent transmittance at wavelength of 157 nm. In addition, PR compositions of the present invention have an excellent etching resistance, heat resistance and adhesiveness to a wafer. Furthermore, PR compositions of the present invention can be easily developed in 2.38 wt % aqueous TMAH solution. Therefore, photoresist compositions of the present invention can be advantageously used as a 157 nm wavelength photoresist layer in a semiconductor device.

When a photoresist composition having a superior adhesiveness is employed, a resolution of 0.13 μm L/S pattern and a satisfactory depth of focus (DOF) can be achieved, even at the photoresist composition thickness of 0.2 μm. Consequently, a reliable high integration semiconductor device can be manufactured by using photoresist compositions of the present invention.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist polymer derived from a monomer comprising:

(a) a compound of the Formula;

1 wherein

R is substituted or unsubstituted linear or branched $(C_1–C_{10})$ alkylene, substituted or unsubstituted $(C_2–C_{10})$ alkylene comprising an other linkage, substituted or unsubstituted $(C_2–C_{10})$ alkylene comprising an ester linkage, or substituted or unsubstituted $(C_3–C_{10})$ alkylene comprising a ketone moiety;

X and Y are independently $CH_2$, $CH_2CH_2$, oxygen or sulfur; and i is an integer from 0 to 2;

(b) a compound of the formula:

2 wherein

V and W are independently $CH_2$, $CH_2CH_2$, oxygen or sulfur;

R* is an acid-labile group; and j is an integer from 0 to 2; and (c) tetrafluoro ethene.

2. The photoresist polymer according to claim 1, wherein said monomer further comprises maleic anhydride.

3. The photoresist polymer according to claim 1, wherein R is of the formula:

1a wherein

Z is or oxygen;

$R_1$ and $R_2$ are independently H or an $(C_1–C_5)$ alkyl; and m and n are independently an integer from 0 to 5, provided m and n are independently an integer from 1 to 5 when Z is oxygen.

4. The photoresist polymer according to claim 1, wherein R* is selected from the group consisting of tert-butyl, tetrahydrofuran-2-yl, tetrahydropyran-2-yl, 2-ethoxyethyl or tert-butoxyethyl.

5. The photoresist polymer according to claim 1, wherein said compound of formula 1 is selected from the group consisting of:

mono-2-ethyl-2-(hydroxymethyl)butyl bicyclo[2.2.1]hept-5-ene-2,3-dicarboxylate;

mono-2-dimethyl-3-hydroxypropyl bicyclo[2.2.1]hept-5-ene-2,3-dicarboxylate;

mono-3-hydroxypropyl bicyclo[2.2.1]hept-5-ene-2,3-dicarboxylate;

mono-2-hydroxyethyl bicyclo[2.2.1]hept-5-ene-2,3-dicarboxylate;

mono-2-ethyl-2-(hydroxymethyl)butyl bicyclo[2.2.2]oct-5-ene-2,3-dicarboxylate;

mono-2-dimethyl-3-hydroxypropyl bicyclo[2.2.2]oct-5-ene-2,3-dicarboxylate;

mono-3-hydroxypropyl bicyclo[2.2.2]oct-5-ene-2,3-dicarboxylate;

mono-2-hydroxyethyl bicyclo[2.2.2]oct-5-ene-2,3-dicarboxylate;

mono-2-ethyl-2-(hydroxymethyl)butyl tetracyclo[4.4.0.1.1]dodec-7-ene-2,3-dicarboxylate;

mono-2-dimethyl-3-hydroxypropyl tetracyclo[4.4.0.1.1]dodec-7-ene-2,3-dicarboxylate;

mono-3-hydroxypropyl tetracyclo[4.4.0.1.1]dodec-7-ene-2,3-dicarboxylate;

mono-2-hydroxyethyl tetracyclo[4.4.0.1.1]dodec-7-ene-2,3-dicarboxylate;

mono-2-ethyl-2-(hydroxymethyl)butyl tetracyclo[4.4.0.2.2]tetradec-7-ene-2,3-dicarboxylate;

mono-2-dimethyl-3-hydroxypropyl tetracyclo[4.4.0.2.2]tetradec-7-ene-2,3-dicarboxylate;

mono-3-hydroxypropyl tetracyclo[4.4.0.2.2]tetradec-7-ene-2,3-dicarboxylate; and mono-2-hydroxyethyl tetracyclo[4.4.0.2.2]tetradec-7-ene-2,3-dicarboxylate.

6. The photoresist polymer according to claim 1, wherein said compound of formula 2 is selected from the group consisting of tert-butyl bicyclo[2.2.1]hept-5-ene-2-carboxylate;

tert-butyl bicyclo[2.2.2]oct-5-ene-2-carboxylate;

tert-butyl tetracyclo[4.4.0.1.1]dodec-7-ene-2-carboxylate; and tert-butyl tetracyclo[4.4.0.2.2]tetradec-7-ene-2-carboxylate.

7. A photoresist polymer represented by the following Chemical Formula 5:

<Chemical Formula 5> wherein
- R is substituted or unsubstituted linear or branched ($C_1$–$C_{10}$) alkylene, substituted or unsubstituted ($C_2$–$C_{10}$) alkylene comprising an ether linkage, substituted or unsubstituted ($C_2$–$C_{10}$) alkylene comprising an ester linkage, or substituted or unsubstituted ($C_3$–$C_{10}$) alkylene comprising a ketone moiety;
- R* is an acid labile group;
- X, Y, V and W are independently $CH_2$, $CH_2CH_2$, oxygen or sulfur;
- i and j are independently an integer from 0 to 2; and
- the ratio of w:x:y:z=0–85 mol %:5–90 mol %:5–90 mol %:5–90 mol %.

8. The photoresist polymer according to claim 7, which is selected from the group consisting of:
Poly(maleic anhydride/mono-2-ethyl-2-(hydroxymethyl) butyl bicyclo-[2.2.1]hept-5-ene-2,3-dicarboxylate/tert-butyl bicyclo-[2.2.1]hept-5-ene-2-carboxylate/tetrafluoro ethylene);
Poly(maleic anhydride/mono-2-ethyl-2-(hydroxymethyl) butyl bicyclo-[2.2.2]oct-5-ene-2,3-dicarboxylate/tert-butyl bicyclo-[2.2.1]hept-5-ene-2-carboxylate/tetrafluoro ethylene); and
Poly(maleic anhydride/mono-2-methyl-2-(hydroxymethyl) propyl bicyclo-[2.2.1]hept-5ene-2,3-dicarboxylate/tert-butyl bicyclo-[2.2.1]hept-5-ene-2-carboxylate/tetrafluoro ethylene).

9. A process for preparing a photoresist polymer of claim 2, comprising the steps of:
(a) admixing (i) a compound of formula 1; (ii) a compound of formula 2; (iii) tetrafluoro ethene, (iv) maleic anhydride; and a polymerization initiator; and
(b) heating the admixture to temperature in the range of 60 to 70° C. for 4 to 24 hours under an inert atmosphere.

10. The process according to claim 9 further comprising an organic solvent, wherein said organic solvent is selected from the group consisting of cyclohexanone, tetrahydrofuran, dimethylformamide, dimethylsulfoxide, dioxane, methyl ethyl ketone, benzene, toluene, xylene, and mixtures thereof.

11. The process according to claim 9, wherein said polymerization initiator is selected from the group consisting of benzoyl peroxide, 2,2'-azobisisobutyronitrile, acetyl peroxide, lauryl peroxide, tert-butyl peracetate, tert-butyl hydroperoxide and di-tert-butyl peroxide.

12. The process according to claim 9, wherein said polymerization is performed by a bulk or solution polymerization.

13. A photoresist composition comprising (i) a photoresist polymer according to claim 1, (ii) an organic solvent and (iii) a photoacid generator.

14. The composition according to claim 13, wherein the photoacid generator is a sulfide or onium-type compound.

15. The composition according to claim 11, wherein the photoacid generator comprises one or more compounds selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroarsenate, triphenylsulfonium triflate and dibutylnaphthylsulfonium triflate.

16. The photoresist composition according to claim 13, wherein the amount of said photoacid generator is in the range of 0.1 to 10% by weight of the polymer employed.

17. The photoresist composition according to claim 13, wherein said organic solvent is selected from the group containing of methyl 3-methoxypropionate, ethyl 3-ethoxypropionate, propylene glycol methyl ether acetate and cyclohexanone.

18. The photoresist composition according to claim 13, wherein the amount of said polymer is in the range of 10 to 30% by weight of said organic solvent employed.

19. A process for forming a photoresist pattern, comprising the steps of:
(a) coating a photoresist composition of claim 13 on a substrate of semiconductor device to form a photoresist film;
(b) exposing said photoresist film to light using a light source; and
(c) developing said exposed photoresist film.

20. The process according to claim 19, further comprising baking step(s) before and/or after step (b).

21. The process according to claim 20, wherein said baking step is performed at temperature in the range of from about 70 to about 200° C.

22. The process according to claim 19, wherein said light source is selected from the group consisting of VUV (157 nm), ArF (193 nm), KrF (248 nm), EUV (13 nm), E-beam, X-ray and ion beam.

23. The process according to claim 19, wherein said step (b) is performed by irradiating 0.1 to 100 mJ/cm² of light-exposure energy.

24. A semiconductor element manufactured by employing the process according to claim 19.

* * * * *

UNITED STATES PATENT AND TRADEMARK OFFICE
CERTIFICATE OF CORRECTION

PATENT NO.   : 6,387,589 B1
DATED        : May 14, 2002
INVENTOR(S)  : Cha Won Koh, Geun Su Lee and Ki Ho Baik It is certified that error appears in the above-identified patent and that said Letters Patent is hereby corrected as shown below:

<u>Column 1,</u>
Line 58, the "cm" should read -- can --.

<u>Column 9,</u>
Line 27, the "other" in claim 1 should read -- ether --.

<u>Column 12,</u>
Line 14, the "claim 11" in claim 15 should read -- claim 13 --.
Line 23, the "hexafluoroarsenate" in claim 15 should read -- hexaflouroantimonate --.
Line 30, the "containing" in claim 17 should read -- consisting --.

Signed and Sealed this

Fifth Day of November, 2002

*Attest:*

*Attesting Officer*

JAMES E. ROGAN
*Director of the United States Patent and Trademark Office*